(12) United States Patent
Dargis et al.

(10) Patent No.: US 9,236,249 B2
(45) Date of Patent: Jan. 12, 2016

(54) III-N MATERIAL GROWN ON REN EPITAXIAL BUFFER ON SI SUBSTRATE

(71) Applicants: Rytis Dargis, Fremont, CA (US); Robin Smith, Palo Alto, CA (US); Andrew Clark, Los Altos, CA (US); Erdem Arkun, San Carlos, CA (US); Michael Lebby, Apache Junction, AZ (US)

(72) Inventors: Rytis Dargis, Fremont, CA (US); Robin Smith, Palo Alto, CA (US); Andrew Clark, Los Altos, CA (US); Erdem Arkun, San Carlos, CA (US); Michael Lebby, Apache Junction, AZ (US)

(73) Assignee: TRANSLUCENT, INC., Palo Alto, CA (US)

( * ) Notice: Subject to any disclaimer, the term of this patent is extended or adjusted under 35 U.S.C. 154(b) by 0 days.

(21) Appl. No.: 13/939,721

(22) Filed: Jul. 11, 2013

(65) Prior Publication Data
US 2015/0014676 A1 Jan. 15, 2015

(51) Int. Cl.
*H01L 21/02* (2006.01)

(52) U.S. Cl.
CPC ...... *H01L 21/02381* (2013.01); *H01L 21/0254* (2013.01); *H01L 21/02433* (2013.01); *H01L 21/02488* (2013.01); *H01L 21/02502* (2013.01)

(58) Field of Classification Search
None
See application file for complete search history.

(56) References Cited

U.S. PATENT DOCUMENTS

| | | | | |
|---|---|---|---|---|
| 7,135,699 B1 * | 11/2006 | Atanackovic | | 257/22 |
| 8,501,635 B1 * | 8/2013 | Clark et al. | | 438/779 |
| 2013/0248853 A1 * | 9/2013 | Arkun et al. | | 257/43 |

* cited by examiner

*Primary Examiner* — Bilkis Jahan
*Assistant Examiner* — Kevin Quinto
(74) *Attorney, Agent, or Firm* — Robert A. Parsons; Michael W. Goltry; Parsons & Goltry

(57) ABSTRACT

A method of growing III-N material on a silicon substrate includes the steps of epitaxially growing a single crystal rare earth oxide on a silicon substrate, epitaxially growing a single crystal rare earth nitride on the single crystal rare earth oxide, and epitaxially growing a layer of single crystal III-N material on the single crystal rare earth nitride.

23 Claims, 4 Drawing Sheets

FIG. 2

| | $Er_2O_3$ | | GaN |
|---|---|---|---|
| | CUBIC | TRANSFORMED TO HEXAGONAL | HEXAGONAL |
| LATTICE PARAMETER, (Å) | $a_c$ | $a_h$ | $a_h$ |
| | 5.273 | 3.729 | 3.189 |
| LATTICE MISMATCH, (%) | | -14.48 | |

| | ErN | | GaN |
|---|---|---|---|
| | CUBIC | TRANSFORMED TO HEXAGONAL | HEXAGONAL |
| LATTICE PARAMETER, (Å) | $a_c$ | $a_h$ | $a_h$ |
| | 4.842 | 3.424 | 3.189 |
| LATTICE MISMATCH, (%) | | -6.9 | |

III-N MATERIAL GROWN ON REN EPITAXIAL BUFFER ON SI SUBSTRATE

FIELD OF THE INVENTION

This invention relates in general to the growth of III-N material on a silicon substrate and more specifically to the formation of a rare earth nitride epitaxial buffer between a silicon substrate and a III-N layer.

BACKGROUND OF THE INVENTION

In the semiconductor industry, it is known that growing a III-N material, such as GaN, on a silicon substrate is difficult due in large part to the large crystal lattice mismatch (−16.9%) and the thermal mismatch (53%) between silicon and GaN. Also, final tensile stress arises during III-N growth on silicon and subsequent cooling of the structure. Thus, some type of buffer layer or layers is generally formed on the silicon substrate and the III-N material is grown on the buffer layer. Generally, the prior art buffer layers, such as an AlN buffer, do no adequately reduce the strain in the silicon substrate or the III-N due to crystal lattice mismatch. Further, during the growth of the III-N material, and especially GaN, diffusion of silicon occurs from the silicon substrate through the AlN buffer and into the III-N material.

It has been found that rare earth nitrides (REN) possess semiconducting and ferromagnetic properties which makes them useful for a large variety of electronic devices. However, there are no free-standing REN substrates. Epitaxial growth on Si is one of the low cost options but the lattice mismatch between Si and REN is several percent (e.g. the mismatch between Si and ErN is a −10.85%). Additionally, the formation of silicide may take place during attempts to grow REN on a Si substrate particularly at the initial stage of the growth.

It would be highly advantageous, therefore, to remedy the foregoing and other deficiencies inherent in the prior art.

Accordingly, it is an object of the present invention to provide new and improved methods for the growth of single crystal III-N material on a silicon substrate.

It is another object of the present invention to provide new and improved methods for the growth of single crystal REN material on a silicon substrate.

It is another object of the present invention to provide new and improved methods for the growth of single crystal III-N material on a silicon substrate using an improved buffer.

It is another object of the present invention to provide new and improved methods for the growth of single crystal REN material on a silicon substrate using an improved buffer.

SUMMARY OF THE INVENTION

The desired objects and aspects of the instant invention are further achieved in accordance with a preferred method of growing III-N material on a silicon substrate. The method includes the steps of epitaxially growing a single crystal rare earth oxide on a silicon substrate, epitaxially growing a single crystal rare earth nitride on the single crystal rare earth oxide, and epitaxially growing a layer of single crystal III-N material on the single crystal rare earth nitride. The rare earth oxide substantially crystal matches the silicon and compressively reduces stresses produced by the silicon substrate to reduce the final tensile stress while the rare earth nitride greatly reduces the lattice mismatch with the III-N material.

The desired objects and aspects of the instant invention are further realized in accordance with a method of growing semiconductor REN material on a silicon substrate including the steps of providing a single crystal silicon substrate and selecting and epitaxially growing one of a single crystal buffer including multiple layers of rare earth oxide and a single crystal buffer including a layer of rare earth oxide and a layer of rare earth oxynitride on the silicon substrate. The selected single crystal buffer has a lower portion adjacent the silicon substrate with a crystal lattice constant matched to silicon and an upper portion adjacent an upper surface with a crystal lattice constant matched to a semiconductor rare earth nitride. The method further includes epitaxially growing on the upper surface of the selected buffer a single crystal semiconductor rare earth nitride layer.

Briefly, the desired objects and aspects of the instant invention are further realized in accordance with a structure including III-N material on a silicon substrate. The structure includes a single crystal epitaxial rare earth oxide positioned on the silicon substrate, an epitaxial single crystal rare earth nitride positioned on the single crystal rare earth oxide, and a layer of single crystal epitaxial III-N material positioned on the single crystal rare earth nitride.

Briefly, the desired objects and aspects of the instant invention are further realized in accordance with a structure including rare earth semiconductor material on a silicon substrate. The structure includes a first single crystal epitaxial rare earth oxide positioned on a silicon substrate. Either a second single crystal epitaxial rare earth oxide or a single crystal rare earth oxynitride is positioned on the first single crystal epitaxial rare earth oxide. A single crystal epitaxial semiconductor rare earth nitride is positioned on the selected one of the second single crystal rare earth oxide and the single crystal rare earth oxynitride.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which:

FIG. 2 is a table illustrating lattice mismatch calculations for the structure of FIG. 1;

DETAILED DESCRIPTION OF THE DRAWINGS

Figure 1:
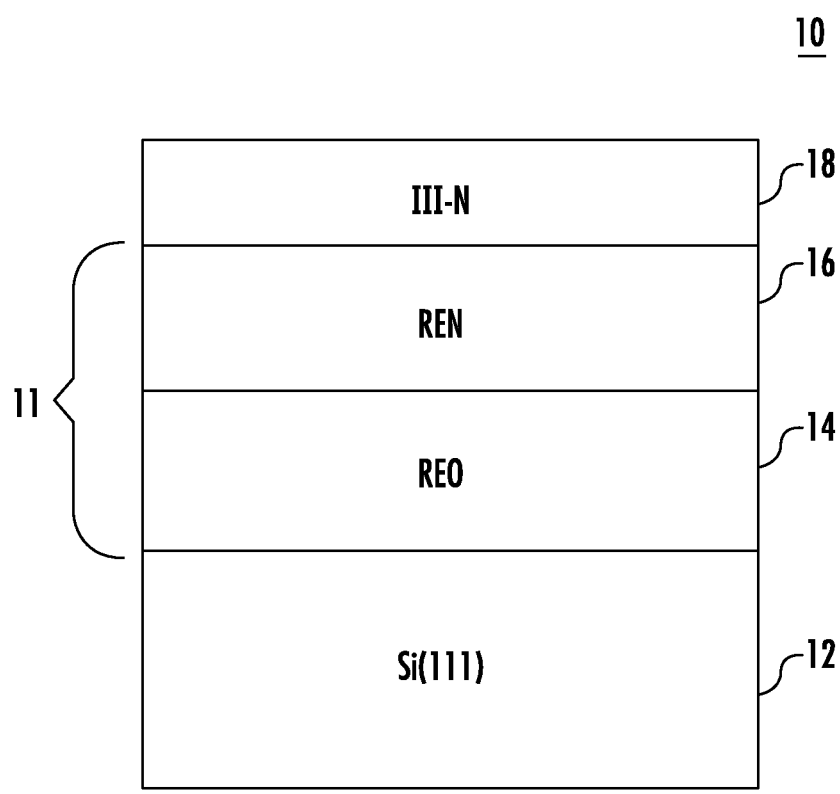
FIG. 1 is a simplified layer diagram illustrating a method of growing III-N material on a silicon substrate, in accordance with the present invention.

Turning to FIG. 1, a simplified layer diagram is illustrated of a structure 10 representing several steps in a process of growing III-N material and in this preferred example GaN on a silicon substrate 12, in accordance with the present invention. It will be understood that substrate 12 is or may be a standard well known single crystal wafer or portion thereof generally known and used in the semiconductor industry. Also, the term "substrate" simply refers to a supporting structure and may be a layer of silicon-containing material positioned on a base layer of other material such as an oxide or the like. Single crystal substrates, it will be understood, are not limited to any specific crystal orientation but could include (111) silicon, (110) silicon, (100) silicon, or any other orientation or variation known and used in the art. However, throughout this disclosure substrate 12 is illustrated with a preferred (111) orientation because of the simplification of further operations.

Silicon has a cubic crystal orientation and many other III-N materials, such as GaN, have a hexagonal crystal orientation. Epitaxially growing hexagonal crystals onto cubic crystals will generally generate huge lattice mismatch and a large dislocation density or crystal defects which will limit the usefulness of the material for device design. Also, final tensile stress arises during III-N growth on silicon and subsequent cooling of the structure. Further, because of the mismatch and subsequent dislocation density or other defects, the thickness of a layer of III-N material is severely limited since the defects expand as the thickness becomes greater. Thus, it is difficult to grow single crystal GaN onto a single crystal silicon substrate since the different crystal structure of the two materials is difficult or impossible to lattice match.

In the present invention, as illustrated in FIG. 1, a buffer 11 of single crystal rare earth oxide 14 and rare earth nitride 16 is epitaxially grown on silicon substrate 12. Structure 10 further includes a layer 18 of III-N material, in this specific example GaN. While erbium is the preferred rare earth material, any rare earth material that crystallizes into a cubic form, such as any of the rare earths with a larger atomic number than gadolinium can be used. Single crystal erbium oxide ($Er_2O_3$) is epitaxially grown on silicon substrate 10 preferably by MBE but could instead be grown by MOCVD or any other technique, depending upon the specific application and additional growth techniques utilized.

Various rare earth oxides have a crystal lattice spacing that can be substantially matched to silicon with very little stress. For example, $Gd_2O_3$ has a crystal lattice spacing (a) of 10.81 Å, $Er_2O_3$ has a crystal lattice spacing (a) of 10.55 Å, $Nd_2O_3$ has a crystal lattice spacing (a) of 11.08 Å, and silicon has a double spacing (2a) of 10.86 Å. For example the lattice mismatch between $Er_2O_3$ and silicon is approximately −2%. Thus, REOa~Si2a herein is defined as a "substantial crystallographic match". Further, the crystal lattice spacing of the REO layers can be varied by varying the composition of the constituents.

As illustrated in the table of FIG. 2, single crystal erbium oxide has a cubic crystal structure with a lattice mismatch relative to GaN of 14.48%. Using GaN as a specific example of III-N material, the GaN has a hexagonal crystal structure. Cubic crystal lattice in (111) direction has similar symmetry as hexagonal lattice in (0001) direction. For this reason, a cubic lattice constant can be mathematically transformed into hexagonal one by dividing the cubic lattice constant by √2. In this way, mismatch between gallium nitride layer and erbium oxide substrate is −14.48%.

Turning back to FIG. 1, in this invention buffer 11 includes layer 16 of single crystal REN grown epitaxially on layer 14 of single crystal REO. Again, erbium is the preferred rare earth material but any rare earth material that crystallizes into a cubic form can be used. Referring additionally to the table of FIG. 2 it can be seen that single crystal erbium nitride (ErN) has a cubic crystal structure. Lattice mismatch of GaN relative to ErN is −6.90%. This mismatch is calculated taking into account that ErN lattice in (111) direction has similar symmetry to that of GaN in (0001) direction. So, cubic lattice constant of ErN can be mathematically transformed to hexagonal one by dividing it by √2. The resulting total mismatch of the GaN layer with single crystal erbium nitride substrate in this specific example is −6.9%, which is a substantial advantage over the mismatch of GaN with erbium oxide.

Thus, in the present novel process, layer 14 of single crystal rare earth oxide is first epitaxially grown on silicon substrate 12 and layer 16 of single crystal rare earth nitride is epitaxially grown on layer 14. Buffer 11, including layers 14 and 16, allows the further epitaxial growth of single crystal III-N material on silicon substrate 12 with substantially reduced stress. Layer 18 of III-N material is grown epitaxially on layer 16 and may be an active semiconductor layer for the formation of various semiconductor devices or additional layers may be epitaxially grown on layer 18. Also, because of the reduced stress, layer 18 can be grown sufficiently thick to form devices therein.

REO layer 14 of buffer 11 also compressively reduces stresses produced by silicon substrate 12 (generally a silicon wafer) before the growth of III-N layer 18, so that final tensile stress that normally would arise during the III-N growth and subsequent cooling of the structure is substantially reduced. That is buffer layer 11 has a smaller lattice constant compared to substrate 12 so that the stress is gradually relaxed with the increasing thickness of buffer layer 11. It is known that during the growth of III-N material, and especially GaN, on prior art AlN buffers, diffusion of silicon occurs from the silicon substrate through the AlN buffer and into the III-N material. In structure 10, REN layer 16 stops the diffusion of silicon into III-N layer 18. Thus, buffer 11 substantially reduces stress in silicon substrate 12 and III-N layer 18 as well as stopping the diffusion of silicon into III-N layer 18.

Here it must be stressed that by epitaxially growing a first layer of rare earth oxide on the silicon substrate, the layer of rare earth nitride can be epitaxially grown as a layer of single crystal material. Also, the combination of the two epitaxial layers that form buffer 11 reduce stress in the III-N layer and allow the sufficient epitaxial growth (thickness) of the III-N material. Also, it will be understood that there is a substantial advantage in using the same rare earth metal for the growth of the REO layer and the growth of the REN layer, since the entire structure 10 can be grown in situ without removal from the chamber and using the same rare earth metal reduces the number of changes of material.

As mentioned above, many rare earth nitrides (REN) posses semiconducting and ferromagnetic properties and, thus, the growth of a single crystal layer of REN on a silicon substrate is potentially useful in the semiconductor industry. However, the growth of REN directly on Si is not practical because of the substantial crystal lattice mismatch and because the formation of silicide during the growth process and particularly at the initial stage. Thus, in the present invention a multilayer rare earth oxide (REO) buffer or platform between a silicon substrate and a REN final semiconducting and ferromagnetic layer is used.

REN has a cubic rock-salt crystal structure which makes it suitable to grow on REO which has a cubic bixbyite crystal structure. Because REO with a cubic bixbyite crystal structure is used, the growth of REN on Si(100), Si(110), Si(111) is possible. Also, the formation of a REO buffer or platform between the silicon substrate and the REN prevents the formation of rare earth silicide during the growth operation.

Figure 3:
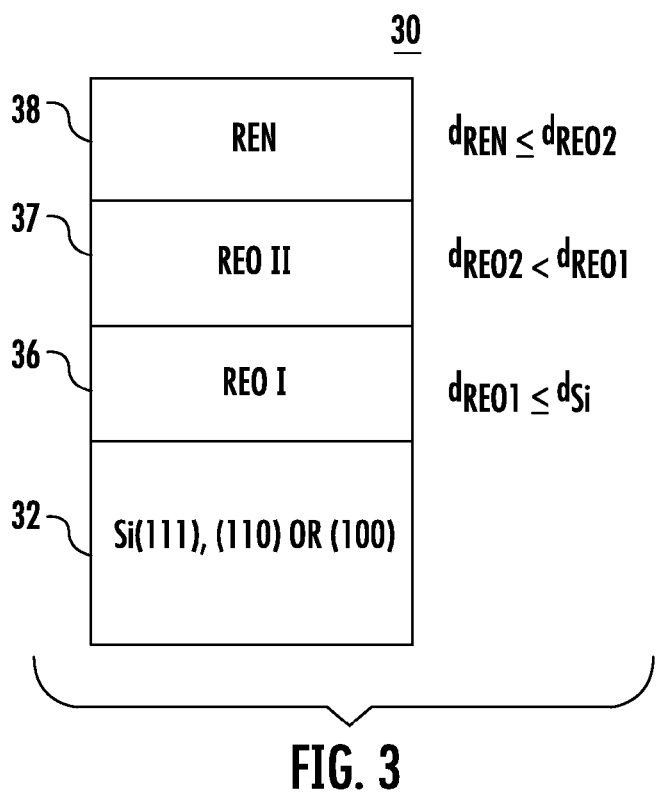
FIG. 3 is a simplified layer diagram illustrating a method of growing an improved buffer for the growth of single crystal REN on a silicon substrate, in accordance with the present invention.

Turning specifically to FIG. 3, a method (and device 30) is illustrated of growing an improved buffer for the growth of single crystal semiconductor REN on a silicon substrate, in accordance with the present invention. Device 30 includes a silicon substrate 32 which may, as described above, include any of a Si(100), Si(110), Si(111) crystal orientation. A first layer 36 including REO I is epitaxially grown on substrate 32. The REO I if first layer 36 is selected so that the lattice constant or in this example the crystal lattice spacing (a) complies with the equation $a_{REO1} \leq 2a_{Si}$. For example, $Er_2O_3$ has a crystal lattice spacing (a) of 10.55 Å and silicon has a double spacing (2a) of 10.86 Å. Thus, the lattice mismatch between $Er_2O_3$ and Si is approximately −2%. For purposes of this disclosure, REO I is defined herein as a "substantial crystallographic match" with Si.

A second layer 37 including REO II is epitaxially grown on first layer 36. Second layer 37 is selected so that the lattice constant or in this example the crystal lattice spacing (a) complies with the equation $a_{REO2} < a_{REO1}$. This equation ensures that the crystal lattice spacing is moved closer to the lattice spacing of rare earth nitride.

A layer 38 of semiconductor rare earth nitride is epitaxially grown on layer 37 of REO II. Both the semiconductor rare earth nitride and REO II are selected so that the lattice constant or in this example the crystal lattice spacing (a) complies with the equation $a_{REN} \leq (\frac{1}{2})a_{REO2}$. This equation ensures that the crystal lattice spacing of rare earth nitride layer 38 is "substantially a crystallographic match" with rare earth oxide layer 37. It will be understood that while REO I and REO II are illustrated and described as two separate layers they could in fact be formed in a single epitaxial growth operation with the material being graded from a spacing close to silicon at the lower surface to a spacing close to the selected semiconductor rare earth nitride at the upper surface. It should also be understood that the rare earth metal of semiconductor REN layer 38 may also be selected to provide a desired amount of semiconductor and/or ferromagnetic properties in REN layer 38.

Figure 4:
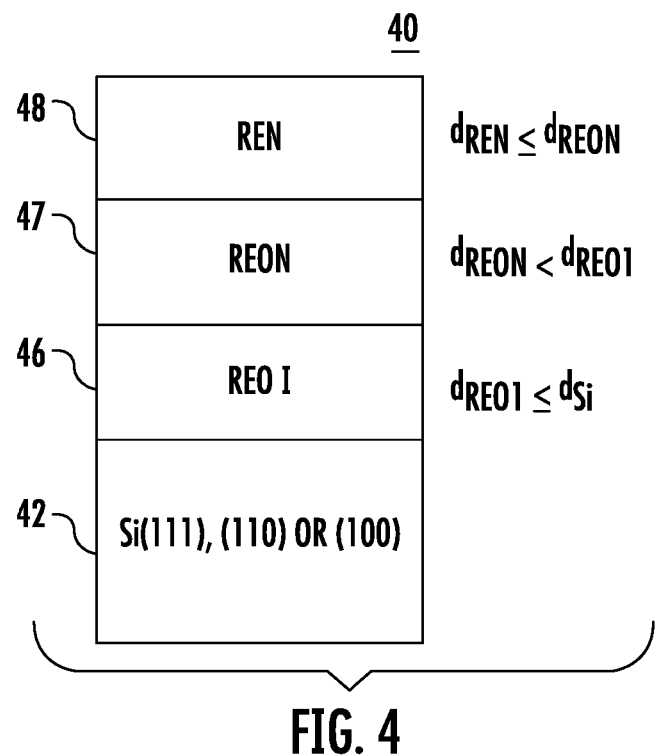
FIG. 4 is a simplified layer diagram illustrating another method of growing an improved buffer for the growth of single crystal REN on a silicon substrate, in accordance with the present invention.

Turning specifically to FIG. 4, another method (and device 40) is illustrated of growing an improved buffer for the growth of single crystal semiconductor REN on a silicon substrate, in accordance with the present invention. Device 40 includes a silicon substrate 42 which may, as described above, include any of a Si(100), Si(110), Si(111) crystal orientation. A first layer 46 including REO I is epitaxially grown on substrate 42. The REO I if first layer 46 is selected so that the lattice constant or in this example the crystal lattice spacing (a) complies with the equation $a_{REO1} \leq 2a_{Si}$. For example, $Er_2O_3$ has a crystal lattice spacing (a) of 10.55 Å and silicon has a double spacing (2a) of 10.86 Å. Thus, the lattice mismatch between $Er_2O_3$ and Si is approximately −2%. For purposes of this disclosure, REO I is defined herein as a "substantial crystallographic match" with Si.

A second layer 47 including a rare earth oxynitride (REON II) is epitaxially grown on first layer 46. Second layer 47 is selected so that the lattice constant or in this example the crystal lattice spacing (a) complies with the equation $a_{REON} < a_{REO1}$. This equation ensures that the crystal lattice spacing is moved closer to the lattice spacing of rare earth nitride. The use of a rare earth oxynitride as a layer between the REO and the REN may more easily allow the close crystal matching of the two layers (i.e. layers 47 and 48) and will provide a larger potential selection or variety of materials that can be used.

A layer 48 of semiconductor rare earth nitride is epitaxially grown on layer 47 of REON. Both the semiconductor rare earth nitride and REON are selected so that the lattice constant or in this example the crystal lattice spacing (a) complies with the equation $a_{REN} \leq a_{REON}$. This equation ensures that the crystal lattice spacing of rare earth nitride layer 48 is "substantially a crystallographic match" with rare earth oxide layer 47. It will be understood that while REO I and REON are illustrated and described as two separate layers they could in fact be formed in a single epitaxial growth operation with the material being graded from a spacing close to silicon at the lower surface to a spacing close to the selected rare earth nitride at the upper surface. It should also be understood that the rare earth metal of semiconductor REN layer 48 may also be selected to provide a desired amount of semiconductor and/or ferromagnetic properties and the use of REON layer 47 provides a larger potential selection or variety of materials that can be used.

It will be understood that in either of the above examples of growing an improved buffer for the growth of single crystal semiconductor REN on a silicon substrate the structure can be used for the further growth of a III-N material as described in conjunction with FIG. 1.

In either of the above examples of growing an improved buffer for the growth of single crystal semiconductor REN on a silicon substrate, the semiconductor REN can be grown using a single step procedure including setting a proper rare earth metal and nitrogen atomic ratio of 1:1. The substrate temperature during the growth is in a range between 500° C. and 850° C. In this specific REN growth example, nitrogen plasma is used as the plasma source.

Figure 5:
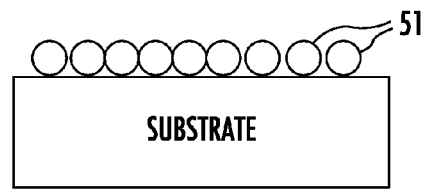
FIGS. 5-7 illustrate steps in a REN metal modulated epitaxy growth process in accordance with the present invention.
Figure 6:
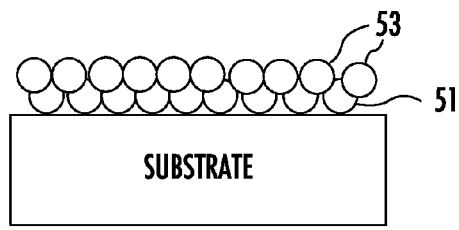
Figure 7:
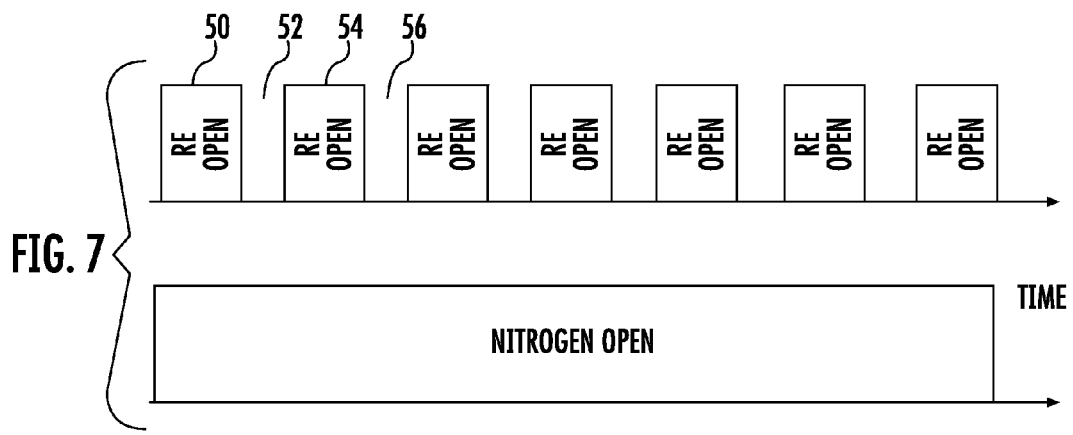

Turning now to FIGS. 5-7, another semiconductor REN growth method is disclosed referred to as a metal modulated epitaxy (MME) method. In the MME method a first step, illustrated in FIG. 5, is to epitaxially deposit or cover the surface of the supporting layer (in the above examples REO II or REON) with 1-2 monolayers of metal atoms, designated 51, during the shutter open step (designated 50 in FIG. 7). In the second step of the MME method the 1-2 monolayers of metal atoms 51 are consumed by nitrogen atoms designated 53 (i.e. modified to a REN layer) during the shutter closed step (designated 52 in FIG. 7). Steps 1 and 2 are repeated N-times (e.g. 54/56 in FIG. 7) until a layer of REN with the desired thickness is grown. The MME growth method allows growth at a lower substrate temperature and consequently a reduced diffusion of oxygen atoms from the supporting REO/REON layer. The MME growth method also makes the growth process more controllable.

Thus, new and improved methods for the growth of single crystal III-N material and new and improved structures grown on a silicon substrate are disclosed. The new and improved methods for the III-N material include the growth of a substantially crystal lattice matching single crystal REO/REN buffer on the silicon substrate. Also, the buffer eliminates or greatly reduces the problem of diffusion of silicon into the III-N material. Further, new and improved methods for the epitaxial growth of single crystal semiconductor REN material and new and improved structures grown on a silicon substrate are disclosed.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of growing III-N material on a silicon substrate comprising the steps of:
   providing a single crystal silicon substrate;
   epitaxially growing a single crystal rare earth oxide on the silicon substrate;
   epitaxially growing a single crystal rare earth nitride on the single crystal rare earth oxide; and
   epitaxially growing a layer of single crystal III-N material on the single crystal rare earth nitride.

2. The method as claimed in claim 1 wherein the step of epitaxially growing the single crystal rare earth oxide includes selecting a rare earth oxide with a cubic crystal structure.

3. The method as claimed in claim 2 wherein the step of epitaxially growing the single crystal rare earth oxide with the cubic crystal structure includes epitaxially growing single crystal erbium oxide ($Er_2O_3$).

4. The method as claimed in claim 1 wherein the step of epitaxially growing the single crystal rare earth nitride includes selecting a rare earth nitride with a cubic crystal structure.

5. The method as claimed in claim 4 wherein the step of epitaxially growing the single crystal rare earth nitride with the cubic crystal structure includes epitaxially growing single crystal erbium nitride (ErN).

6. The method as claimed in claim 1 wherein the step of epitaxially growing the single crystal rare earth oxide and the step of epitaxially growing the single crystal rare earth nitride include using the same rare earth metal.

7. The method as claimed in claim 6 wherein the step of epitaxially growing the single crystal rare earth oxide and the step of epitaxially growing the single crystal rare earth nitride using the same rare earth metal includes using erbium to form $Er_2O_3$ and ErN.

8. The method as claimed in claim 1 wherein the step of epitaxially growing the layer of single crystal III-N material includes epitaxially growing GaN.

9. A method of growing III-N material on a silicon substrate comprising the steps of:
   providing a single crystal silicon substrate;
   epitaxially growing a single crystal rare earth oxide with a cubic crystal structure on the silicon substrate;
   epitaxially growing a single crystal rare earth nitride with a cubic crystal structure on the single crystal rare earth oxide; and
   epitaxially growing a layer of single crystal III-N material on the single crystal rare earth nitride.

10. The method as claimed in claim 9 wherein the step of epitaxially growing the single crystal rare earth oxide and the step of epitaxially growing the single crystal rare earth nitride include using the same rare earth metal.

11. The method as claimed in claim 10 wherein the step of epitaxially growing the single crystal rare earth oxide and the step of epitaxially growing the single crystal rare earth nitride using the same rare earth metal includes using erbium to form $Er_2O_3$ and ErN.

12. A method of growing semiconductor REN material on a silicon substrate comprising the steps of:
   providing a single crystal silicon substrate;
   selecting and epitaxially growing one of a single crystal buffer including multiple layers of rare earth oxide and a single crystal buffer including a layer of rare earth oxide and a layer of rare earth oxynitride on the silicon substrate, the selected single crystal buffer having a lower portion adjacent the silicon substrate with a crystal lattice constant substantially matched to silicon and having an upper portion adjacent an upper surface with a crystal lattice constant substantially matched to a semiconductor rare earth nitride; and
   epitaxially growing on the upper surface of the selected buffer a single crystal semiconductor rare earth nitride layer.

13. The method as claimed in claim 12 wherein the step of selecting and growing the buffer includes selecting and growing multiple layers of rare earth oxide, and the multiple layers of rare earth oxide include a lower layer RE01 and an upper layer REO2, the multiple layers are each further selected to have a crystal lattice conforming to the equation $a_{REO2} < a_{REO1}$.

14. The method as claimed in claim 13 wherein the step of selecting the buffer having the lower portion with the crystal lattice constant matched to silicon includes selecting a REO material for the lower portion conforming to the equation $a_{REO1} < 2a_{Si}$, and the step of selecting the buffer having the upper portion with the crystal lattice constant matched to the semiconductor rare earth nitride includes selecting a rare earth oxide material for the upper portion and a semiconductor rare earth nitride material so as to conform to the equation $a_{REN} < (1/2) a_{REO2}$.

15. The method as claimed in claim 12 wherein the step of selecting and growing the buffer includes selecting and growing the layer of rare earth oxide and the layer of rare earth oxynitride, and the layer of rare earth oxide and the layer of rare earth oxynitride are each further selected to have a crystal lattice conforming to the equation $a_{REON} < a_{REO1}$.

16. The method as claimed in claim 15 wherein the step of selecting the buffer having the lower portion with the crystal lattice constant matched to silicon includes selecting a REO material for the lower portion conforming to the equation $a_{REO1} < 2a_{Si}$, and the step of selecting the buffer having the upper portion with the crystal lattice constant matched to the semiconductor rare earth nitride includes selecting a rare earth oxynitride material for the upper portion and the semiconductor rare earth nitride material so as to conform to the equation $a_{REN} < a_{REON}$.

17. III-N material on a silicon substrate comprising:
   a single crystal silicon substrate;
   a single crystal epitaxial rare earth oxide positioned on the silicon substrate;
   a single crystal epitaxial rare earth nitride positioned on the single crystal rare earth oxide, wherein the single crystal epitaxial rare earth nitride includes a rare earth nitride with a cubic crystal structure; and
   a layer of single crystal epitaxial III-N material positioned on the single crystal rare earth nitride.

18. The III-N material on a silicon substrate as claimed in claim 17 wherein the single crystal epitaxial rare earth nitride with the cubic crystal structure includes single crystal erbium nitride (ErN).

19. The III-N material on a silicon substrate as claimed in claim 17 wherein the layer of single crystal epitaxial III-N material includes single crystal epitaxial GaN.

20. The III-N material on a silicon substrate as claimed in claim 17 wherein the single crystal epitaxial rare earth oxide includes a rare earth oxide with a cubic crystal structure.

21. The III-N material on a silicon substrate as claimed in claim 20 wherein the single crystal epitaxial rare earth oxide with the cubic crystal structure includes single crystal erbium oxide ($Er_2O_3$).

22. The III-N material on a silicon substrate as claimed in claim 17 wherein the single crystal epitaxial rare earth oxide and the single crystal epitaxial rare earth nitride include the same rare earth metal.

23. The III-N material on a silicon substrate as claimed in claim 22 wherein the single crystal epitaxial rare earth oxide and the single crystal epitaxial rare earth nitride include erbium in the form of $Er_2O_3$ and ErN.

* * * * *